United States Patent [19]
Osborne

[11] 3,842,415
[45] Oct. 15, 1974

[54] ANALOG-TO-DIGITAL CONVERTER WITH ADAPTIVE FEEDBACK

[75] Inventor: Paul Wray Osborne, Neptune, N.J.

[73] Assignee: Bell Telephone Laboratories, Incorporated, Murray Hill, Berkeley Heights, N.J.

[22] Filed: Nov. 8, 1973

[21] Appl. No.: 413,918

[52] U.S. Cl. .......................... 340/347 AD, 235/194
[51] Int. Cl. .......................... H03k 13/16
[58] Field of Search .......................... 340/347 AD, 347 NT

[56] References Cited

UNITED STATES PATENTS

| | | | |
|---|---|---|---|
| 2,969,535 | 1/1961 | Foulkes | 340/347 AD |
| 3,170,153 | 2/1965 | Brooks | 340/347 AD |
| 3,396,384 | 8/1968 | Loos et al. | 340/347 AD |
| 3,462,759 | 8/1969 | Hoffman | 340/347 AD |
| 3,577,194 | 5/1971 | Beall | 340/347 AD |
| 3,603,975 | 9/1971 | Gordon | 340/347 AD |
| 3,703,002 | 11/1972 | Van Saun | 340/347 AD |

*Primary Examiner*—Felix D. Gruber
*Assistant Examiner*—Vincent J. Sunderdick
*Attorney, Agent, or Firm*—Daniel D. Dubosky

[57] ABSTRACT

A successive approximation encoder is disclosed in which a negative resistance circuit is connected with a capacitor to successively increase the input magnitudes to be encoded. The negative resistor-capacitor combination is chosen such that the exponential signal produced in response to each input signal sample increases by a predetermined factor between preetermined time intervals. For example, in a binary encoder, the exponential signal would double between each time interval. By successively comparing the exponential signal with a threshold level in the binary encoder, a binary digit is generated at the end of each time interval. With this arrangement, a simple network accurately operates as a multiplier in a successive approximation encoder. Multiplicand accuracy is maintained by applying test sequences to the interconnected capacitor and negative resistance circuit between coding periods and deriving, in response to encoder variations, a signal from which the proper relationship between the length of the predetermined intervals and the negative resistor-capacitor combination can be maintained.

10 Claims, 13 Drawing Figures

FIG. 2
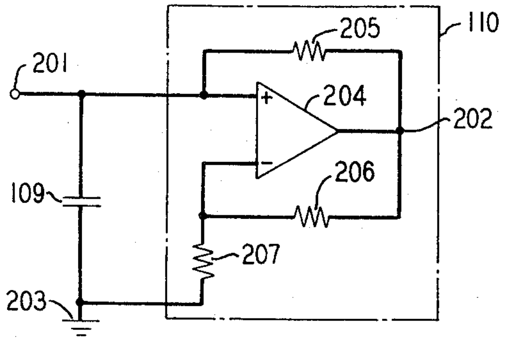
FIG. 3A
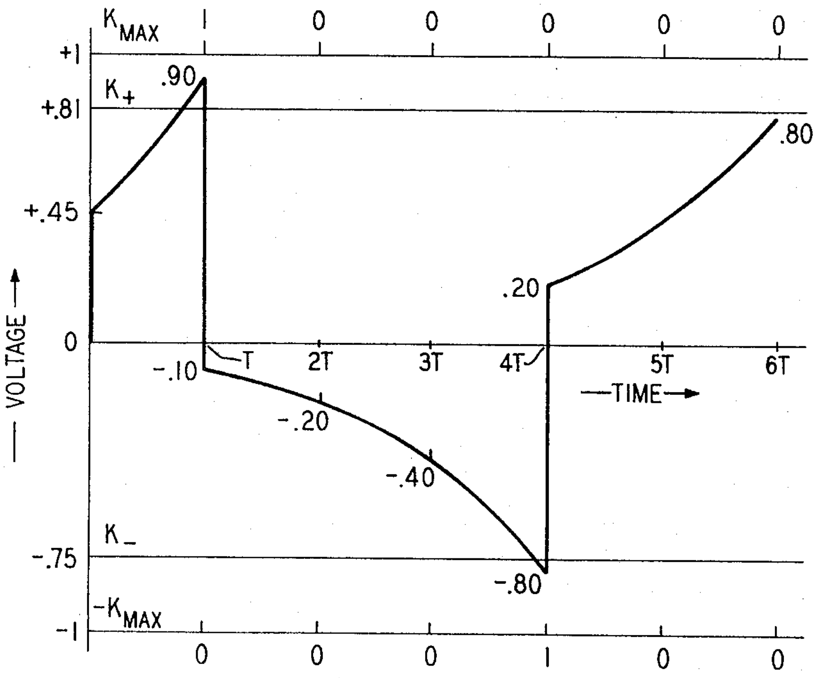
FIG. 3B
|   |   |   |   |   |   |   |
|---|---|---|---|---|---|---|
|   | 1 | 0 | 0 | 0 | 0 | 0 |
| − | 0 | 0 | 0 | 1 | 0 | 0 |
|   | 0 | 1 | 1 | 1 | 0 | 0 |

ANALOG-TO-DIGITAL CONVERTER WITH ADAPTIVE FEEDBACK

BACKGROUND OF THE INVENTION

This invention relates to successive approximation encoders and, more particularly, to successive approximation encoders using a negative resistor-capacitor network as a multiplier.

Prior art binary successive approximation coders encode analog input signal magnitudes into a binary digital representation by determining each binary digit in a decreasing order of significance. Each digit is determined on a trial and error basis by successively comparing the input to be encoded with a series of reference levels. As each additional digit is determined, the number of quantization levels into which the input signal is encoded is doubled to increase the accuracy of encoding. In binary successive approximation encoders of this type, each binary digit is determined by comparing the input signal to be encoded with varying reference levels, where the latter are a function of the previously determined digits. Therefore, prior to each comparison, the next reference level is adjusted in accordance with the previous comparison. After a sequence of such comparisons, the word formed by the successively produced digits is the digital representation of the input analog signal.

Alternatively, rather than comparing the fixed input signal with a sequence of varying reference levels, an input signal may be compared with fixed reference levels by varying the signal to be encoded in accordance with the previous comparisons. In prior art encoders of this type, the input signal, or a function of the input signal, is multiplied by a factor of two between each comparison. In particular, the input signal to be encoded is successively multiplied by a factor of two and compared with the reference level, a binary "0" being produced at each comparison when the cumulative product is less than the reference level, and a binary "1" being produced when the product exceeds the reference. Following each comparison in which the reference is exceeded, the cumulative product is incrementally reduced by the magnitude of the reference level. The resultant difference, below the reference level, is multiplied by a factor of two and compared with the reference level at the next successive comparison. After a predetermined number of comparisons, the word formed by the successive binary 0s and 1s is a digital representation of the input signal.

Ternary successive approximation encoders require a multiplier that successively triples the signal to be encoded between each comparison and quaternary encoders similarly require a multiplier that multiplies the signal to be encoded by a factor of four between comparisons.

Successive approximation encoders thus require a multiplier that will repeatedly multiply an input signal applied thereto by a predetermined factor for a plurality of successive comparisons with a fixed reference signal.

An object of this invention is to simplify the network that can be employed as a multiplier in a successive approximation encoder.

An additional object of this invention is to maintain the multiplicand accuracy of the multiplier in a successive approximation encoder throughout the encoding procedures.

SUMMARY OF THE INVENTION

In the encoder of the present invention, input analog samples to be encoded are applied to a multiplier comprising a parallel connected capacitor and negative resistor. In response to each input sample, the multiplier produces an exponential signal having an initial magnitude proportional to the magnitude of the sample to be encoded. The values of the negative resistor-capacitor combination are chosen such that the initial magnitude of the exponential signal repetitively increases by a predetermined factor between predetermined time intervals. At the end of each predetermined time interval, the exponential signal is compared with the threshold level of at least one level detector. At the end of each interval, a digit from the set of possible digit symbols is generated by comparing the exponential signal and the threshold level. When, at the end of an interval, the exponential signal exceeds a threshold level, a current source network decreases by a predetermined amount the magnitude of the exponential signal appearing across the interconnected capacitor and negative resistor. The resultant signal, having a magnitude below the threshold level, continues to exponentially increase by the predetermined factor to the next time interval, at which time a comparison with the threshold level is again made. Following a predetermined number of time intervals, the digital word formed by the successively generated digital symbols is the coded digital representation of the input signal.

In order to more accurately encode each input signal, the exponential signal appearing across the interconnected capacitor and negative resistor must increase by the predetermined factor between each time interval. Therefore, a feedback signal, from which the time intervals are adjusted, is derived from the multiplier in response to encoder variations to maintain multiplicand accuracy. The feedback signal is derived by interleaving between coding periods test sequences comprising voltage increments applied across the parallel connected capacitor and negative resistor. A signal is derived from the response of the multiplier to the test sequences from which the length of the time intervals is adjusted. Therefore, the relationship between the negative resistor-capacitor combination and the predetermined time intervals will be maintained such that a signal applied across the network will precisely increase by a predetermined factor between each time interval. A simple and accurate network, therefore, may be employed as a multiplier in a successive approximation encoder.

BRIEF DESCRIPTION OF THE DRAWINGS

FIG. 2 is a network that may be used as the multiplier in the present invention;

FIGS. 3A and 3B are a waveform and chart useful in illustrating the binary coding procedure of the present invention;

DETAILED DESCRIPTION

Figure 1:
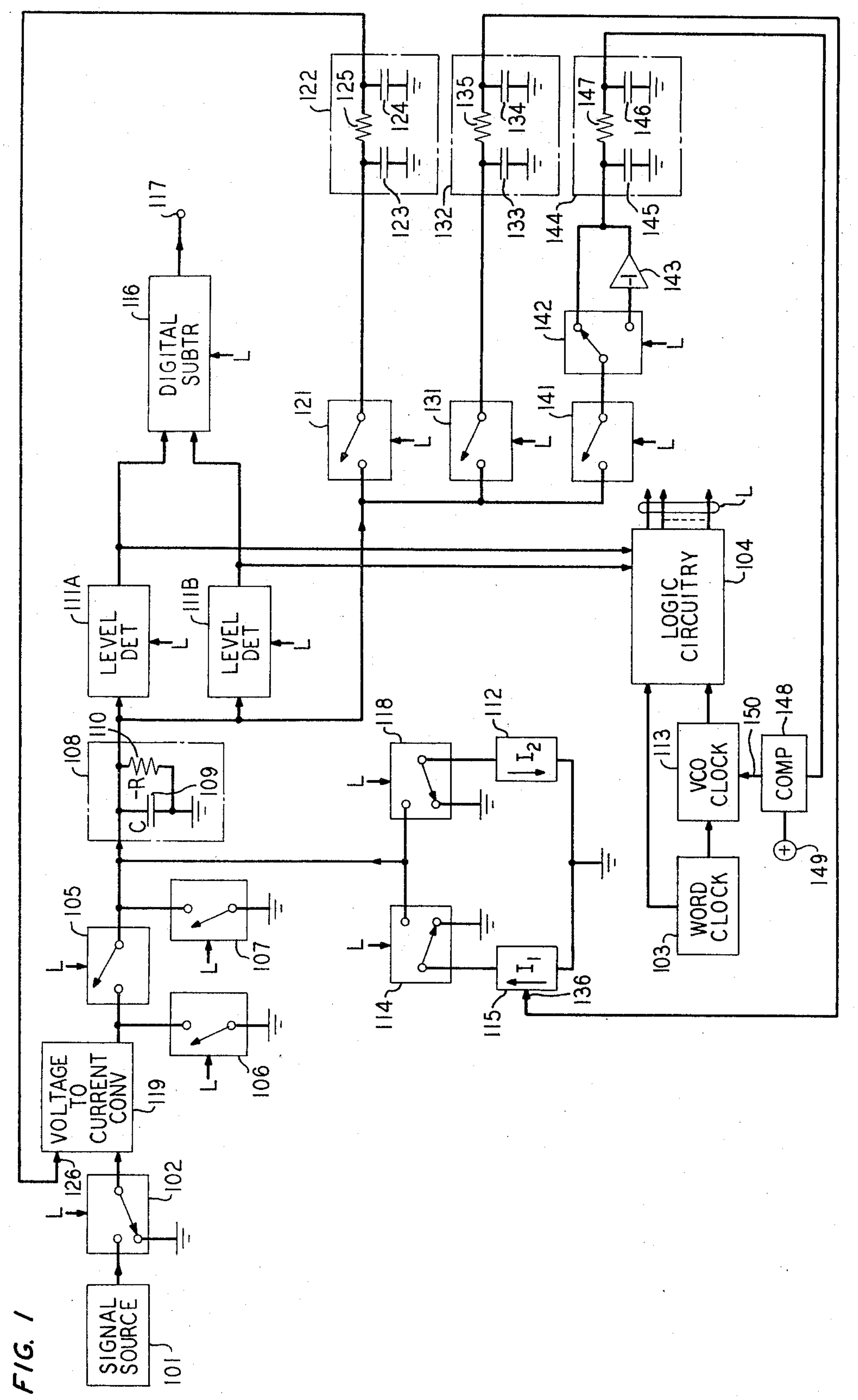
FIG. 1 is a binary successive approximation encoder embodying the present invention.

With reference to FIG. 1, an analog time-varying signal to be binary encoded is applied from a signal source 101 to a sampling switch 102. The frequency of a word clock 103 determines the rate at which the input signal is sampled by sampling switch 102. Word clock 103 is connected to a logic circuit 104. Logic circuit 104 comprises well-known gating and logic circuits, and is connected to sampling switch 102 and other switches and networks to be discussed hereinafter. The connections from logic circuit 104 to the various switches and networks are symbolically illustrated by the plurality of L output lines from logic circuit 104 and the L designated inputs to the various switches and networks. Logic circuit 104 closes sampling switch 102 for a predetermined time in response to each clock pulse from word clock 103. Logic circuit 104 could easily be implemented by any one of several logic arrangements obvious to one skilled in the particular art from the functional operation to be described hereinbelow. Therefore, for purposes of the following discussion, only the functional operation of logic circuit 104 as it controls the logical operation of the hereinafter described encoder will be discussed.

Voltage-to-current converter 119, connected to sampling switch 102, converts the sampled input voltage into a current the magnitude of which is proportional to the magnitude of the input sample. Prior to each sampling instant, logic circuit 104 opens shorting switches 106 and 107. At each sampling instant, logic circuit 104 closes the otherwise opened switch 105. Switches 105, 106 and 107 may comprise transistors controlled by voltages on their base electrodes. After a predetermined time interval, switch 105 is reopened. The charge that flows during the time interval in which switch 105 is closed is proportional to the current at the output of voltage-to-current converter 119 and is thus proportional to the sampled input voltage.

Switch 105 is connected to multiplier 108. Multiplier 108 is symbolically represented in FIG. 1 as a capacitor 109, having a value of C and a negative resistor 110, having a value −R, connected in parallel to a common ground reference potential. An actual illustrative network that might be employed is illustrated in FIG. 2. Similar numerical representations are used on components that appear in both FIGS. 1 and 2. With reference to FIG. 2, multiplier 108 comprises capacitor 109 connected between an input terminal 201 and a reference ground potential 203. Input terminal 201 is connected to the positive input of a differential amplifier 204. Resistor 205, having a value R, connects the positive input terminal of differential amplifier 204 and output terminal 202 of differential amplifier 204; and resistor 206, also having a value R, bridges the input terminal of differential amplifier 204 and output terminal 202. A third resistor 207, also having a value R, connects the negative input of differential amplifier 204 to ground potential 203. It can be easily shown that the voltage at output terminal 202 is twice the voltage at terminal 201. Since no current flows through operational amplifier 204, a current flows through resistor 205 towards terminal 201 with a magnitude equal to the voltage at terminal 201 divided by the value R of resistor 205. Therefore, the voltage-current characteristic of the network 110 connected between terminal 201 and ground potential 203 has a negative slope equal to −R and network 110 is thus equivalent to a negative resistor.

With reference again to FIG. 1, the charge that flows during the interval in which switch 105 is closed is transferred to capacitor 109. The voltage measured across capacitor 109 in response to this transferred charge is thus proportional to the input voltage sampled by switch 102. It will be assumed for the illustrative purposes of the present discussion that the transferred charge is instantaneously deposited on capacitor 109 and that at each sample instant the voltage across the parallel interconnected capacitor 109 and negative resistor 110 is proportional to the input voltage sampled by sampling switch 102.

The response of multiplier 108 to each sampled input voltage may be represented by the equation:

$$V(t) = Ke^{-t/-RC} \tag{1}$$

where $t$ is time, $K$ is the initial voltage across capacitor 109, $R$ is the absolute value of negative resistor 110, $C$ is the value of capacitor 109 and $V(t)$ is the time-varying voltage across capacitor 109. Since multiplier 108 comprises a negative resistor and a capacitor, the voltage produced across capacitor 109 in response to an initial voltage will be the exponential signal of Equation 1 that increases, rather than decreases, with time.

In accordance with the exponentially increasing function of Equation 1, the initial voltage, K, across capacitor 109 can be shown to successively double between predetermined equal increments of time, T, where T is equal to:

$$T = RC \ln 2 \tag{2}$$

Thus, at each integral multiple of T, the voltage across capacitor 109 may be represented as:

$$v(nT) = K2^n, \text{ where } n = 0,1,2,\ldots,N \tag{3}$$

The initial voltage K across the parallel interconnected capacitor 109 and negative resistor 108 will therefore be successively doubled between each equal increment of time, T seconds long.

Multiplier network 108 is connected to level detectors 111A and 111B. The thresholds of level detectors 111A and 111B are chosen to be $K_{max}$ and $-K_{max}$, respectively, where $K_{max}$ is the absolute magnitude of the maximum signal magnitude which can be encoded. In accordance with one of the features of the present invention, the use of two level detectors having a positive and negative threshold, respectively, enables the encoder to self correct for threshold inaccuracies that would otherwise result in coding errors. Therefore, level detectors 111A and 111B require less critical circuit components. As will be described hereinafter, the encoder of the present invention will correctly encode each sampled input signal if the actual threshold, $K_+$, of level detector 111A is less than $K_{max}$, and the actual threshold, $K_-$, of level detector 111B is greater than $-K_{max}$. If desired, however, one level detector having a threshold $K_{max}$ may be employed in the practice of the present proposal. In such a system, a negative signal could be inverted either before being applied to multiplier 108 or before being compared with the threshold $K_{max}$.

Word clock 103 is connected to VCO clock 113, the latter having a natural frequency such that a clock pulse is produced every T seconds; T being determined from Equation 2. A clock pulse from word clock 103 triggers VCO clock 113 into operation at the sampling rate. At integral multiples of T seconds, hereinafter referred to as bit instants, the resultant exponentially increasing voltage across the parallel interconnected capacitor 109 and resistor 110 is compared with both $K_+$ and $K_-$ threshold levels.

Logic circuit 104 is connected to level detectors 111A and 111B. At each bit instant, in response to the clock pulses from VCO clock 113, the voltage at the output of multiplier 108 is compared with the thresholds of level detectors 111A and 111B. At each bit instant in which the output voltage of multiplier 108 is greater than the threshold $K_+$, level detector 111A produces a binary 1. If, however, the output voltage of multiplier 108 is less than $K_+$, level detector 111A produces a binary 0. In response to each binary 1 produced by level detector 111A, switch 118 is closed by logic circuit 104 for a predetermined time period and a current $I_2$ from current source 112 is applied to multiplier 108 to incrementally decrease the charge and the voltage across capacitor 109 by a magnitude $K_{max}$. Although a finite interval of time is required to effect the incremental change, it will again be assumed for the illustrative purposes of the present discussion that the voltage reduction is incremented instantaneously at a bit instant. In summary, therefore, at each bit instant of time, determined by the clock frequency of VCO clock 113, level detector 111A produces a binary 0 when the voltage across capacitor 109 and negative resistor 110 is less than the threshold $K_+$. If, however, the voltage is greater than the threshold $K_+$, a binary 1 is produced and the voltage across capacitor 109 and negative resistor 110 is simultaneously reduced by $K_{max}$. The resultant signal across capacitor 109 and negative resistor 110 continues to exponentially increase and double between each next successive T second time intervals.

The use of two level detectors having positive and negative thresholds, respectively, eliminates the necessity for precisely determined threshold levels to effect accurate encoding. At each bit instant during which the exponential signal exceeds the threshold of level detector 111A, the voltage across capacitor 109 and negative resistor 110 is reduced by $K_{max}$. Thus, if the threshold $K_+$ of level detector 111A is less than $K_{max}$, an incremental change of $K_{max}$ could reduce the voltage across capacitor 109 and negative resistor 110 below zero. In accordance with Equation 1, the response of the −RC network to an initial negative voltage will be an exponential signal, the magnitude of which absolutely increases in the negative direction. Thus, all next successive comparisons with the positive threshold $K_+$ of level detector 111A will result in the generation of binary 0s. Therefore, the digital words formed by the successive comparisons would incorrectly represent the sampled input signal. By using a second level detector having a threshold below the threshold $K_+$, the exponential signal appearing across capacitor 109 and negative resistor 110 can be constrained to prevent the exponential signal from increasing without bound in the negative direction. The voltage across capacitor 109 and negative resistor 110 is thereby limited between fixed positive and negative boundaries. The use of two level detectors thus allows a flexability in threshold levels that would not otherwise be permissible if only one level detector was used. As heretofore noted, however, the present invention may be practiced with one level detector having a threshold $K_{max}$ volts since the resultant voltage across capacitor 109 and negative resistor 110 after each incremental change of $K_{max}$ volts will be greater than zero. Thus, the exponential signal will not increase in the negative direction and the successive binary 1s and 0s produced at each bit instant by the unitary level detector is the binary digital representation of the magnitude of the input signal sample.

As hereinbefore noted, the output of multiplier 108 is also compared with the threshold of level detector 111B in response to the clock pulses from VCO clock 113. A binary 0 is produced at each bit instant in which the voltage across capacitor 109 and negative resistor 110 is greater than the threshold $K_-$, and a binary 1 is produced when the voltage is less than the threshold $K_-$. At each bit instant in which a binary 1 is produced by level detector 111B, switch 114 is closed by the logic circuit 104 for a predetermined interval and a current $I_1$ from current source 115 is applied to multiplier 108. The voltage across capacitor 109 and negative resistor 110 is now increased by $K_{max}$ in response to current $I_1$.

After a predetermined number of bit instants, level detectors 111A and 111B each produce a digital word comprising the successively produced binary 1s and 0s. Digital subtractor 116, connected to the outputs of level detectors 111A and 111B, subtracts, under the control of logic circuit 104, the digital word having the smaller magnitude from the digital word having the larger magnitude. A sign bit is added preceding the first bit of resultant digital difference. The resultant digital word at output terminal 117 is therefore a sign plus a magnitude binary digital representation of the voltage sampled by sampling switch 102.

An example of this coding procedure is illustrated in FIGS. 3A and 3B. The gain of voltage-to-current converter 119 may be chosen such that the analog signals to be encoded will have a magnitude between +1 and −1. For these magnitudes, the nominal thresholds, $K_{max}$ and $-K_{max}$, of level detectors 111A and 111B would be +1 volt and −1 volt, respectively. However, due to component inaccuracies, an actual threshold $K_+$, of level detector 111A could be .81 volt, and the actual threshold $K_-$ of level detector 111B could be −.75 volt, as illustrated in FIG. 3A. The input magnitude chosen to be encoded is .45 volt. For present illustrative purposes, therefore, the voltage across capacitor 109 and negative resistor 110 at the initial sampling instant will have a magnitude of .45 volt. As discussed heretofore, between the initial sampling instant and the first bit instant T seconds later, the voltage across capacitor 109 and negative resistor 110 will double to .90 volt in accordance with Equation 3, as is shown in FIG. 3A. Since this is greater than the threshold of level detector 111A, the voltage across capacitor 109 and negative resistor 110 is incrementally reduced by 1.0 volt to −.10 volt. Since the voltage across capacitor 109 and negative resistor 110 is below zero, the resultant signal across capacitor 109 and negative resistor 110 commences to increase absolutely in the negative direction in accordance with Equations 1 and 3. At 4T seconds following the sampling instant, the voltage across capacitor 109 and negative resistor 110 has decreased to −.80 volt and is therefore below the threshold of level detector 111B. The voltage across capacitor 109 and negative resistor 110 is then incrementally increased by 1.0 volt to .2 volt. This positive voltage exponentially increases to .80 volt by time 6T. As illustrated in FIG. 3A, the binary word formed by level detector 111A at time 6T is thus 100000 and the word formed by level detector 111B is 000100. Digital subtractor 116 subtracts the word formed by level detector 111B from the word formed by level detector 111A to produce the digital word 011100, which represents the magnitude 28. Since the full scale 6-bit word has 64 possible values, the digital word 011100 decodes into 28/64 or .4375. Therefore, the error introduced by coding .45 into a digital representation is the difference between .45 and .4375. Digital subtractor 116 adds a sign bit preceding the coded magnitude. The sign plus 6-bit magnitude representation of the input +.45 is 0011100, where the first 0 sign bit represents a positive magnitude.

The encoder of the present invention may require periodic adjustment to compensate for variations in network parameters that would otherwise result in inaccurate encoding. A significant feature of the present invention is that compensation is automatically performed in response to variations that might produce an incorrectly coded signal. This compensation is achieved without interrupting the coding procedures.

In accordance with one aspect of the present invention, automatic compensation is achieved by applying digital test sequences to multiplier 108 in between sampling instants. The test sequences are applied to the encoder without taking the encoder out of service. The responses of multiplier 108 to the test sequences are used to derive signals from which network adjustment can be made.

Figure 4A:
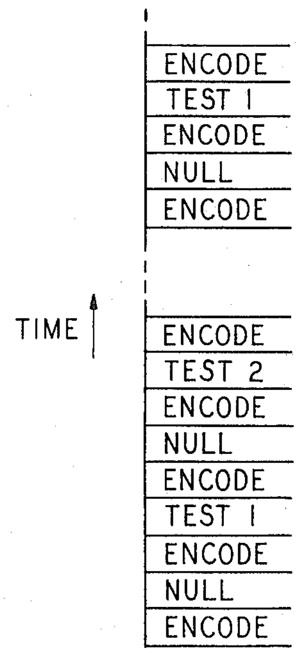
FIGS. 4A, 4B and 4C show sequences used to test and automatically adjust the present invention.

Three test sequences, Test 1, Test 2, and Null, may be used to test the illustrative embodiment of the present invention and are interlaced between coding periods in a manner illustrated in FIG. 4A. Thus, after digital subtractor 116 produces an output code word representing the sampled input signal, but prior to the next sampling instant, a digital sequence comprising positive and negative charge increments is applied to capacitor 109 by an appropriate opening and closing sequence of switches 114 and 118.

Following the formation of an output code word, logic circuit 104 closes switches 106 and 107 to short the voltage across capacitor 109 to zero, after which the switches 106 and 107 are opened. Logic circuit 104 then closes switches 114 and 118 in the predetermined pattern of the appropriate test sequence at the clock pulse rate of VCO clock 113. Test 1, illustrated in FIG. 4B, comprises a positive charge increment at an initial test instant followed by a series of negative charge increments, at successive clock pulse intervals. At the initial test instant of Test 1, switch 114 is closed by logic circuit 104 fo a predetermined period of time. A fixed positive charge is thus deposited by current source 115 on capacitor 109. At the following test instants, initiated by clock pulses from VCO clock 113, logic circuit 104 closes switch 118 for predetermined time intervals to incrementally decrease the charge on capacitor 109. For the illustrative embodiment of the present invention shown in FIG. 1, the positive and negative charge increments are chosen such that the responsive voltage increments across capacitor 109 and negative resistor 110 are +1 volt and −1 volt, respectively.

Figure 4B:
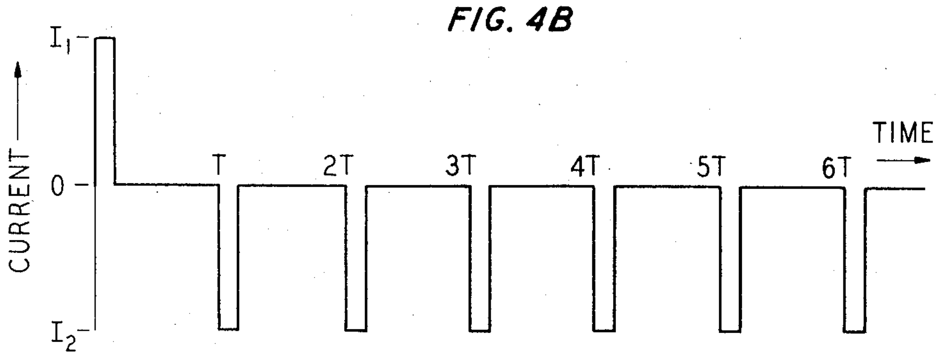
Figure 5A:
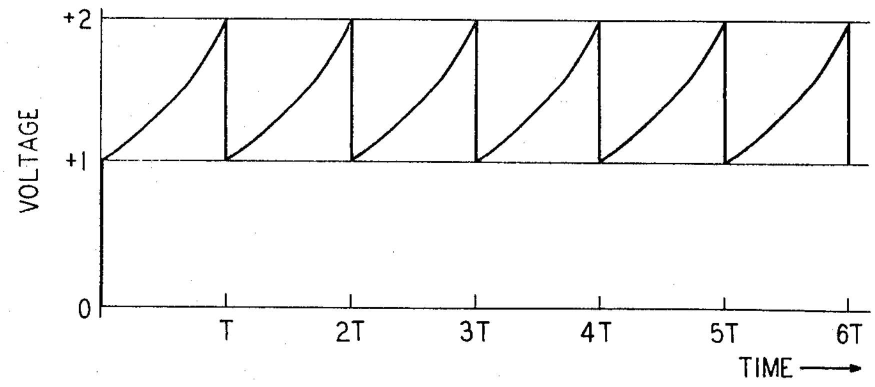
FIGS. 5A, 5B, 6A, 6B, 7A and 7B are waveforms illustrating the response of the network of FIG. 2 to the test sequences of FIGS. 4B and 4C.

The response of multiplier 108 to test sequence Test 1 of FIG. 4B is illustrated in FIG. 5A. At the initial test instant, the positive charge increment from current source 115 produces a voltage of 1.0 volt across capacitor 109 and negative resistor 110 which, in accordance with Equation 3, exponentially increases in T seconds to 2.0 volts. At this instant, however, a negative charge increment from current source 112 reduces the voltage across capacitor 109 to 1.0 volt, which in turn will increase to 2.0 volts at 2T seconds following the initial test instant. As can be observed in FIG. 5A, the response of multiplier 108 to test sequence Test 1 will be a sawtooth type signal that exponentially increases from 1.0 volt to 2.0 volts between each test instant.

Figure 4C:
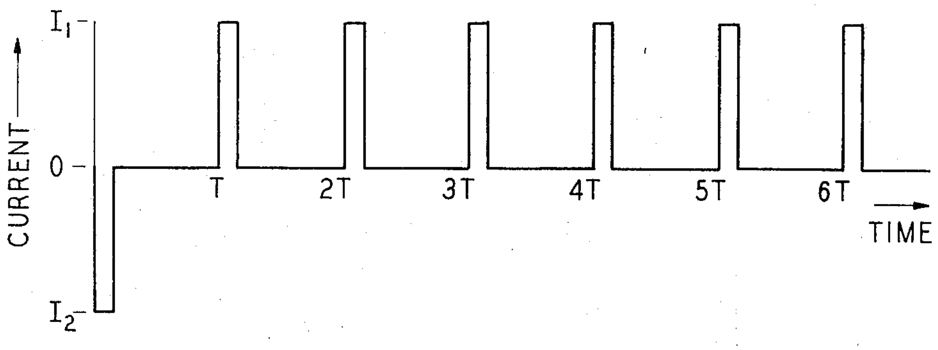
Figure 5B:
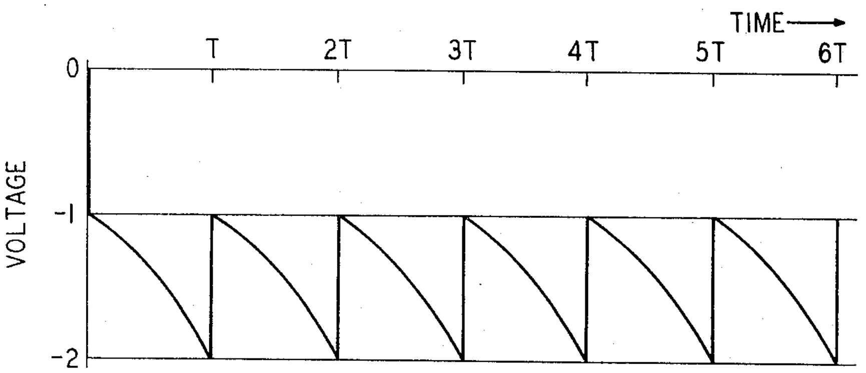

The test sequence Test 2, illustrated in FIG. 4C, comprises a negative pulse increment followed by a series of positive pulse increments at the clock pulse rate of VCO clock 113. Switches 114 and 118 are closed in an order interchanged from that described hereinabove for Test 1. The response of multiplier 108 to test sequence Test 2, as illustrated in FIG. 5B, is a sawtooth type signal the absolute magnitude of which exponentially increases between −1.0 volt and −2.0 volts between each test instant.

During the Null test sequence neither positive nor negative pulse increments are applied to multiplier 108. At the initial test instant, logic circuit 104 closes switch 105 for a predetermined instant. Since switch 102 is at the ground position at all times except sample instants, the input to voltage-to-current converter 119 is 0.0 volts. Therefore, the response of multiplier 108 to the Null 0.0 volt input is a 0.0 volt output.

A response of multiplier 108 to the test sequences divergent from the hereinabove described responses is indicative of the deviation of an encoder parameter that will result in an incorrect coding of the input analog signals. In accordance with one aspect of the present invention, proper encoder compensation is effected by examining the response of multiplier 108 to the digital test sequences and varying an adjustable encoder parameter in response thereto.

As was heretofore noted, the Null test sequence should produce a zero voltage output. Therefore, if after a predetermined number of test instants a positive or negative voltage is present at the output of multiplier 108, then voltage-to-current converter 119 is producing a finite current in response to a zero input voltage. Compensation is thus required to correct the offset between each voltage sampled by sampling switch 102 and each corresponding initial voltage across capacitor 109.

As illustrated in FIG. 1, switch 121 is connected to multiplier 108. Averaging circuit 122, comprising capacitors 123 and 124 and resistor 125 interconnected as shown, is connected between switch 121 and the offset control terminal 126 of voltage-to-current converter 119. After a predetermined number of clock pulses from VCO clock 113 within each Null test sequence, logic circuit 104 closes switch 121 to sample the output of multiplier 108. The time constants of averaging circuit 122 are chosen such that its output is the average of the signals sampled by sampling switch 121 over a plurality of Null test sequences. Voltage-to-current converter 119 is adjusted in response to a positive or negative voltage at the offset control terminal 126, and compensation is effected. Voltage-to-current converter 119 may be one of several networks well known in the art comprising, for example, an operational amplifier to isolate an input voltage from an output current. Offset control terminal 126 may be connected to one input of the operational amplifier such that, in response to a positive or negative voltage at the output of averaging circuit 122, voltage-to-current converter 119 will neutralize an input circuit offset to ensure that a zero voltage input will produce a zero current output.

Figure 6A:
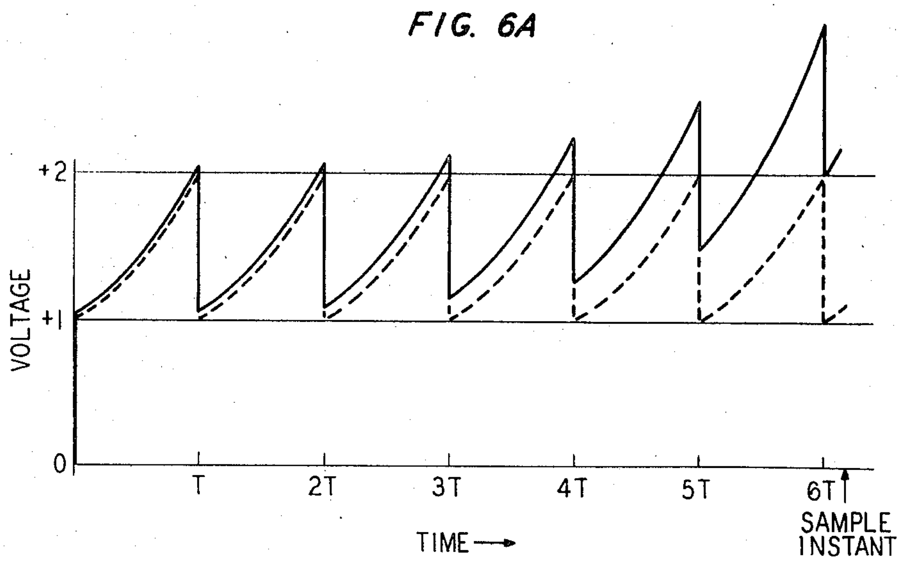
Figure 6B:
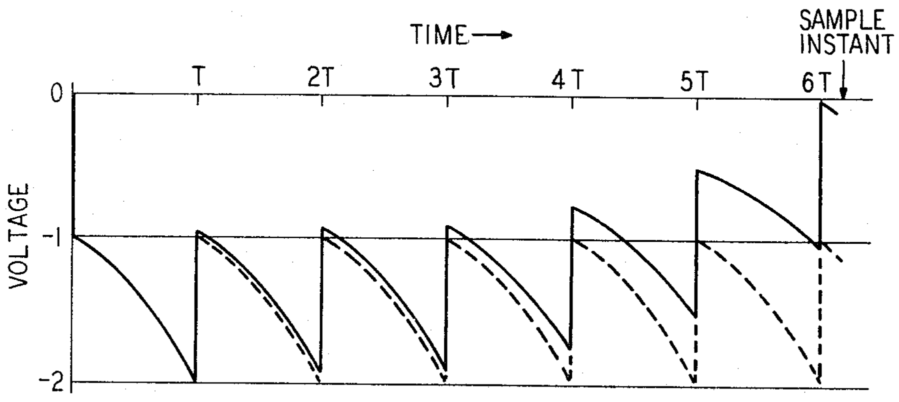

An imbalance between current sources 112 and 115 will likewise cause coding errors. Therefore, current sources 112 and 115 must be balanced such that the voltage increments of equal magnitude are applied across capacitor 109 and negative resistor 110. FIGS. 6A and 6B illustrate the responses of multiplier 108 to test sequences Test 1 and Test 2, respectively, when current source 115 produces a positive voltage increment greater in magnitude than the negative voltage increment produced by current source 112. As illustrated, the responses of multiplier 108 to Test 1 and Test 2 both increase in the positive direction at each test instant. An imbalance such that the positive voltage increment is less than the negative voltage increment will similarly shift the response of multiplier 108 to Test 1 and Test 2 in the negative direction.

In order to maintain the balance between the positive and negative voltage increments, a signal is derived from a feedback network to effect this compensation. With reference again to FIG. 1, switch 131 is connected to multiplier 108. Averaging circuit 132, comprising capacitors 133 and 134, and resistor 135, interconnected as shown, is connected between switch 131 and adjustment terminal 136 of current source 115. At a predetermined instant after the last test instant, in both Test 1 and Test 2 intervals, logic circuit 104 closes switch 131 to sample the response of multiplier 108. The time constants of averaging circuit 131 are chosen such that the output of averaging circuit 132 is the average of the signals sampled by switch 131 over several Test 1 and Test 2 sequences. When the current sources 112 and 115 are balanced, the time-averaged output of averaging circuit 132 will be 0.0 volt. An imbalance, however, will produce a voltage at the output of averaging circuit 132, the sign aand magnitude of the output voltage being determinative of the direction and magnitude, respectively, of the imbalance. Averaging circuit 132 thus provides a feedback error signal to current source 115 from which the balance of the voltage increments may be maintained.

A third feedback signal is derived to maintain the precision of multiplier 108 whereby each initial voltage applied across capacitor 109 and negative resistor 110 will precisely double between each clock pulse generated by VCO clock 113. If, however, the components of multiplier 108 vary, then the relationship between the time constant of multiplier 108 and the clock pulse rate of VCO clock 113, as determined by Equation 2, will no longer be maintained. The exponential signal will therefore increase by more than or less than a factor of two between each VCO clock pulse to result in incorrectly coded input signals.

Figure 7A:
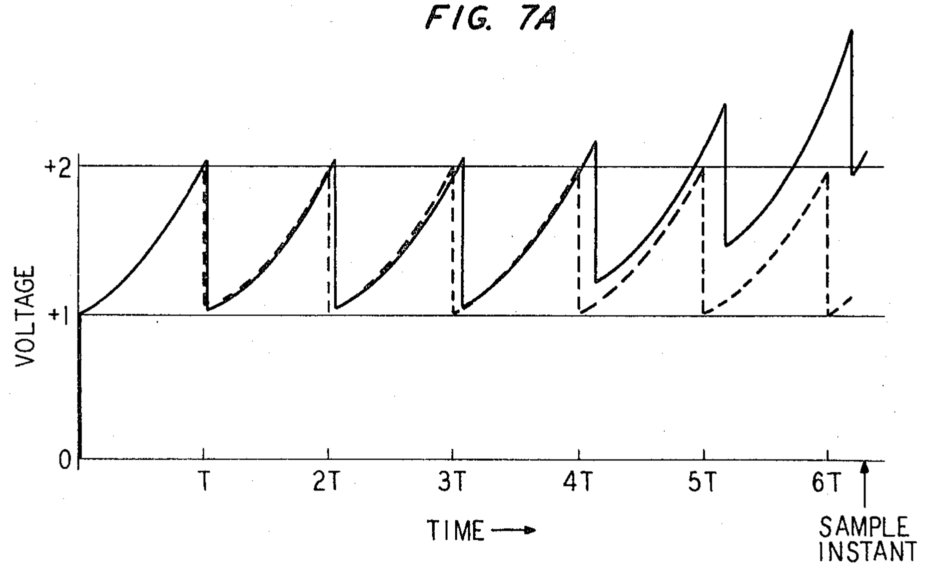
Figure 7B:
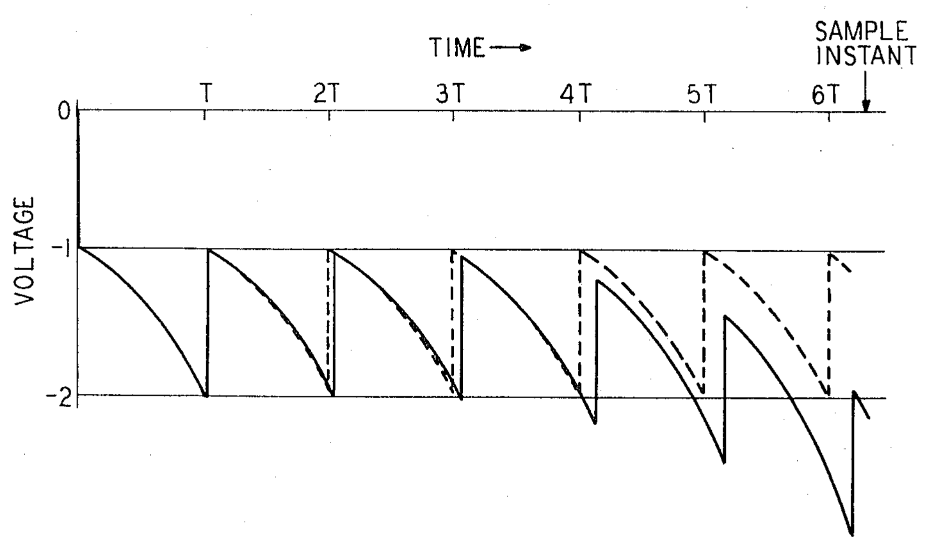

FIGS. 7A and 7B illustrate the responses of multiplier 108 to test sequences Test 1 and Test 2, respectively, when the time between each clock pulse is too long such that the exponential signal more than doubles between each clock pulse. As can be observed in FIGS. 7A and 7B, the resultant responses of multiplier 108 to Test 1 and Test 2 both absolutely increase. Similarly, if the clock pulses are spaced too closely together, then the responses of multiplier 108 to Test 1 and Test 2 will both absolutely decrease.

In order to maintain the relationship of Equation 2 between the magnitudes of capacitor 109 and negative resistor 110 and the period of pulses produced by VCO clock 113, an error signal is derived in a feedback network from which compensation may be made. With reference again to FIG. 1, switch 141 is connected to multiplier 148. Switch 142 connects the output of switch 141 to either inverting amplifier 143 or to averaging circuit 144. Inverting amplifier 143 inverts the sign of the signal appearing at its input. Averaging circuit 144 comprises capacitors 145 and 146, and resistor 147, interconnected as shown. The output of averaging circuit 144 and the output of reference voltage source 149 are connected to voltage comparator 148. The output of voltage comparator 148 is connected to control input 150 of VCO clock 113. Switch 141 is closed by logic circuit 104 after a predetermined number of clock pulses to sample the response of multiplier 108 to Test 1 and Test 2. Logic circuit 104 alternates switch 142 between averaging circuit 144 and inverting amplifier 143 in response to Test 1 and Test 2, respectively. The time constants of averaging circuit 144 are chosen such that the output of averaging circuit 144 is the average of the response of multiplier 108 to Test 1 sampled by switch 141 and the inverted response of multiplier 108 to Test 2 sampled by switch 141, over a plurality of Test 1 and Test 2 sequences. Reference voltage source 149 has a value equal to the expected voltage output of averaging circuit 144 when the frequency of VCO clock 113 is correctly adjusted to multiplier 108. The sign and magnitude of the error voltage at the output of voltage comparator 148 is the difference between the expected and actual voltage output of averaging circuit 144 and therefore indicative of the direction and magnitude of the correction needed to realign the frequency of VCO clock 113 with multiplier 108 in accordance with Equation 2.

In summary, the feedback network connecting the output of multiplier 108 and voltage-to-current converter 119 is responsive to zero offset. Imbalance between current sources 112 and 115 is eliminated by deriving, in a second feedback network, an error signal from which correction may be made. A third feedback network maintains the precision of multiplier 108 by deriving an error signal that adjusts the frequency of VCO clock 113 in response to multiplier variations.

Various other modifications of the present invention may be made without departing from the spirit and scope of the invention. Although the present invention has been described for use in a binary encoder, it may be similarly employed in encoders with other numerical bases, for example, a ternary encoder. In the latter encoder the period of the VCO clock 113 would be chosen such that the exponential signal triples between each generated clock pulse. In a manner similar to that heretofore described for the binary encoder, the exponential signals would be compared with at least two threshold levels and a digit generated at each clock pulse.

The above-described embodiment is illustrative of the application of the principles of the invention. Other embodiments may be devised by those skilled in the art without departing from the spirit and scope of the invention.

I claim:

1. An encoder for encoding analog samples into digital representations comprising an encoder input terminal for receiving each of said input analog samples, a multiplier connected to said input terminal to multiply each successive sample at the input of said multiplier by a predetermined factor betweeen predetermined time intervals, at least one level detector connected to said multiplier to compare the output of said multiplier with a predetermined threshold at the end of each of said time intervals, said at least one level detector producing a first digit at the end of each of said time intervals when the output of said multiplier is less than said threshold, and a second digit at the end of each of said time intervals when the output of said multiplier is greater than said threshold, network means connected to said multiplier and said at least one level detector to change the output of said multiplier by a constant value at the end of each of said time intervals when the output of said at least one level detector is said second digit, and means connecting an encoder output terminal to said at least one level detector to receive the digital word formed by the successive digits produced by said at least one level detector, said multiplier comprising the combination of a parallel interconnected capacitor and negative resistor means to produce exponential signals in response to each of said input samples, the product of the values of said capacitor and negative resistor means being such that the absolute magnitude of each of said exponential signals increases by said predetermined factor between said predetermined time intervals.

2. An encoder for coding analog signals into digital representations as defined in claim 1 wherein the encoder further includes a feedback network connecting said multiplier and said network means to adjust timing of the comparisons of said exponential signal with said threshold by said at least one level detector in response to multiplier variations, whereby the relationship between the length of said predetermined time intervals and the product of the values of said capacitor and negative resistor is maintained.

3. An encoder for coding analog signals into digital representations as defined in claim 2 wherein said network means includes charge variation means for applying a charge increment to said capacitor at the end of said predetermined time intervals in response to the digit produced by said level detector and for applying predetermined sequences of positive and negative charge increments to said capacitor between coding periods, each of said charge increments being interspaced by said predetermined time intervals, such that the signal derived by said feedback network from said multiplier in response to said sequence of said predetermined charge increments adjusts said predetermined time interval to thereby maintain the relationship between the length of said predetermined intervals and the product of the values of said capacitor and negative resistor.

4. An encoder for encoding analog signals into digital representations as defined in claim 3 wherein the encoder further includes a second feedback network connecting said multiplier and said charge variation means to adjust magnitude of the charge increments generated by said charging variation means such that the signal derived by said second feedback network from said multiplier in response to said predetermined sequence of charge increments adjusts the magnitude of the charge increments generated by said charge variation means to thereby maintain an equal magnitude response of said multiplier to each positive charge increment and to each negative charge increment.

5. An encoder for coding input analog samples into binary digital representations comprising an encoder input terminal for receiving each of said input analog samples, a multiplier connected to said input terminal to multiply each successive sample at the input of said multiplier by a factor of two between predetermined time intervals, said multiplier comprising a parallel connected capacitor and negative resistor means to produce in response to each of said input samples exponential signals having initial values proportional to each of said input samples, the product of the values of said capacitor and negative resistor means being such that the absolute magnitude of each exponential signal doubles between said predetermined time intervals, a timing clock to produce clock pulses interspaced by said time intervals, a level detector connected to said multiplier and said timing clock to compare the voltage across said parallel connected capacitor and negative resistor means with a predetermined threshold in response to the clock pulses from said timing clock, said level detector producing a first binary digit at the end of each of said time intervals when the voltage across said interconnected capacitor and negative resistor means is less than said predetermined threshold, and a second binary digit at the end of each of said time intervals when the voltage across said interconnected capacitor and negative resistor means is greater than said predetermined threshold, and network means connected to said parallel capacitor and negative resistor means to said level detector and to said timing clock to change the voltage across said parallel connected capacitor and negative resistor by a constant value at the end of each of said time intervals when the output of said level detector is said second binary digit, and an encoder output terminal connected to said level detector, whereby after a predetermined number of time intervals the digital word formed by the successive first and second binary digits produced by said level detector is a binary digital representation of the analog sample at said encoder input terminal.

6. An encoder for coding analog signals into binary digital representations as defined in claim 5 wherein said timing clock is a voltage controlled oscillator clock, and said encoder further includes a feedback network connected between said interconnected capacitor and negative resistor means and said voltage controlled oscillator clock to adjust the period of said clock pulses in response to multiplier variations, whereby the relationship between the length of said predetermined time intervals and the product of the values of said capacitor and negative resistor means is maintained.

7. An encoder for coding analog signals into digital representations as defined in claim 6 wherein said network means includes charge variation means for applying a charge increment to said capacitor at the end of said predetermined time intervals in response to the digit produced by said level detector and for applying predetermined sequences of positive and negative charge increments to said capacitor between coding periods, each of said charge increments being interspaced by said predetermined time intervals, such that the signal derived by said feedback network from said multiplier in response to said sequence of said predetermined charge increments adjusts said predetermined time interval to thereby maintain the relationship between the length of said predetermined intervals and the product of the values of said capacitor and negative resistor.

8. An encoder for coding analog samples into binary digital representations comprising an encoder input terminal for receiving each of said input analog samples, a multiplier connected to said input terminal to multiply the sample at the input of said multiplier by a factor of two between predetermined time intervals, said multiplier comprising a parallel connected capacitor and negative resistor means to produce in response to each of said input samples exponential signals having initial values proportional to each of said input samples, the product of the values of said capacitor and negative resistor being such that the absolute magnitude of each exponential signal doubles between said time intervals, a timing clock to produce clock pulses interspaced by said time intervals, a first level detector connected to said multiplier to compare the voltage across said parallel capacitor and negative resistor means with a first threshold in response to a clock pulse from said timing clock, a second level detector connected to said multiplier to compare the voltage across said parallel connected capacitor and negative resistor with a second threshold in response to a clock pulse from said timing clock, said first threshold being greater than said second threshold, said first level detector producing a first binary digit at the end of each of said time intervals when the voltage across said parallel connected capacitor and negative resistor means is less than said first threshold, and a second binary digit at the end of said time intervals when the voltage across said parallel connected capacitor and negative resistor means is greater than said first threshold, said second level detector producing said first binary digit at the end of each of said time intervals when the voltage across said parallel connected capacitor and negative resistor means is greater than said second threshold, and said second binary digit at the end of each of said time intervals when the voltage across said parallel capacitor and negative resistor means is less than said second threshold, network means connected to said interconnected capacitor and negative resistor means and said first and second level detectors to reduce the voltage across said parallel connected capacitor and negative resistor means by a constant value at the end of each of said time intervals when the output of said first level detector is said second binary digit, and to increase the voltage across said interconnected capacitor and negative resistor means by said constant value at the end of each of said time intervals when the output of said second level detector is said second binary digit, a digital subtractor connected to said first and second level detectors, and an encoder output terminal connected to said digital subtractor, such that after a predetermined number of time intervals the digital difference between digital words formed by the binary digits successively developed by said first and second level detectors is a digital representation to the input of the analog signal at said encoder input terminal.

9. An encoder for coding analog signals into binary digital representations as defined in claim 8 wherein said timing clock is a voltage controlled oscillator clock, and said encoder further includes a feedback network connected between said interconnected capacitor and negative resistor means and said voltage controlled oscillator clock to adjust the period of said clock pulses in response to multiplier variations, wherein the relationship between the length of said predetermined time intervals and the product of the values of said capacitor and negative resistor means is maintained.

10. An encoder for coding analog signals into digital representations as defined in claim 9 wherein said network means includes charge variation means for applying a charge increment to said capacitor at the end of said predetermined time intervals in response to the digit produced by said level detector and for applying predetermined sequences of positive and negative charge increments to said capacitor between coding periods, each of said charge increments being interspaced by said predetermined time intervals, such that the signal derived by said feedback network from said multiplier in response to said sequence of said predetermined charge increments adjusts said predetermined time interval to thereby maintain the relationship between the length of said predetermined intervals and the product of the values of said capacitor and negative resistor.

* * * * *